(12) United States Patent
Kuo et al.

(10) Patent No.: US 10,439,583 B2
(45) Date of Patent: Oct. 8, 2019

(54) SPLIT RING RESONATOR ANTENNA (71) Applicant: Arcadyan Technology Corporation, Hsinchu (TW)

(72) Inventors: Shin-Lung Kuo, Hsinchu (TW); Shih-Chieh Cheng, Hsinchu (TW)

(73) Assignee: Arcadyan Technology Corporation, Hsinchu (TW)

( * ) Notice: Subject to any disclaimer, the term of this patent is extended or adjusted under 35 U.S.C. 154(b) by 0 days.

(21) Appl. No.: 15/874,378

(22) Filed: Jan. 18, 2018

(65) Prior Publication Data
US 2018/0234072 A1    Aug. 16, 2018

(30) Foreign Application Priority Data
Feb. 10, 2017   (TW) .............................. 106104519 A (51) Int. Cl.
| H03H 7/38 | (2006.01) |
| H01Q 1/38 | (2006.01) |
| H01Q 13/18 | (2006.01) |
| H01Q 1/48 | (2006.01) |
| H01Q 1/50 | (2006.01) |
| H01Q 7/00 | (2006.01) |

(52) U.S. Cl.
CPC .............. *H03H 7/38* (2013.01); *H01Q 1/38* (2013.01); *H01Q 1/48* (2013.01); *H01Q 1/50* (2013.01); *H01Q 7/00* (2013.01); *H01Q 13/18* (2013.01)

(58) Field of Classification Search
CPC .......... H01P 5/107; H01Q 7/00; H01Q 13/16; H01Q 13/10
See application file for complete search history.

(56) References Cited

FOREIGN PATENT DOCUMENTS

| JP | 2007155597 A | * | 6/2007 |
| JP | 2015179938 A | | 10/2015 |

OTHER PUBLICATIONS

Liu, Wen-Chung et al, article entitled "Parasitically Loaded CPW-FedMonopole Antenna for Broadband Operation", IEE Transactions on Antennas and Propagation, vol. 59, No. 6, Jun. 1, 2011, pp. 2415-2419.

* cited by examiner

*Primary Examiner* — Graham P Smith
*Assistant Examiner* — Jae K Kim
(74) *Attorney, Agent, or Firm* — Bever, Hoffman & Harms, LLP (57) ABSTRACT

A split ring resonator (SRR) antenna is disclosed. The SRR antenna comprises a substrate, a basic feeding portion, a conductive layer, a first capacitive, a conducting element and a second capacitive. The substrate has an outer edge, a first surface and a second surface opposite to the first surface. The basic feeding portion disposed on the first surface. The conductive layer is disposed on the second surface, and has a gap and a cavity. The first conductive layer defines two sides of the gap to be a first inner edge and a second inner edge, and a first matching element and a second matching are formed from the first inner edge and the second inner edge respectively. The cavity is connected to the outer edge of the substrate through the gap. The second capacitive coupling route is formed between the conducting element and the second matching element.

7 Claims, 7 Drawing Sheets

SPLIT RING RESONATOR ANTENNA

CROSS-REFERENCE TO RELATED APPLICATION AND CLAIM OF PRIORITY

The application claims the benefit of Taiwan Patent Application No. 106104519, filed on Feb. 10, 2017, at the Taiwan Intellectual Property Office, the disclosures of which are incorporated herein in their entirety by reference.

FIELD OF THE INVENTION

The present invention is related to a split ring resonator antenna, and more particularly to a split ring resonator antenna disposed on a multi-layered printed circuit board for broadband communications.

BACKGROUND OF THE INVENTION

For the applications of wireless communication and the need of communication bandwidth, along with the miniaturization of the 3C products, antenna devices disposed on the electronic products require not only minimizing the size, but also sustaining the efficacy of broadband. Taking the IEEE802.11 standard for example, the transmission scope of an antenna has to have sufficient bandwidth to realize the specification of the main band of 5 GHz.

Figure 1:
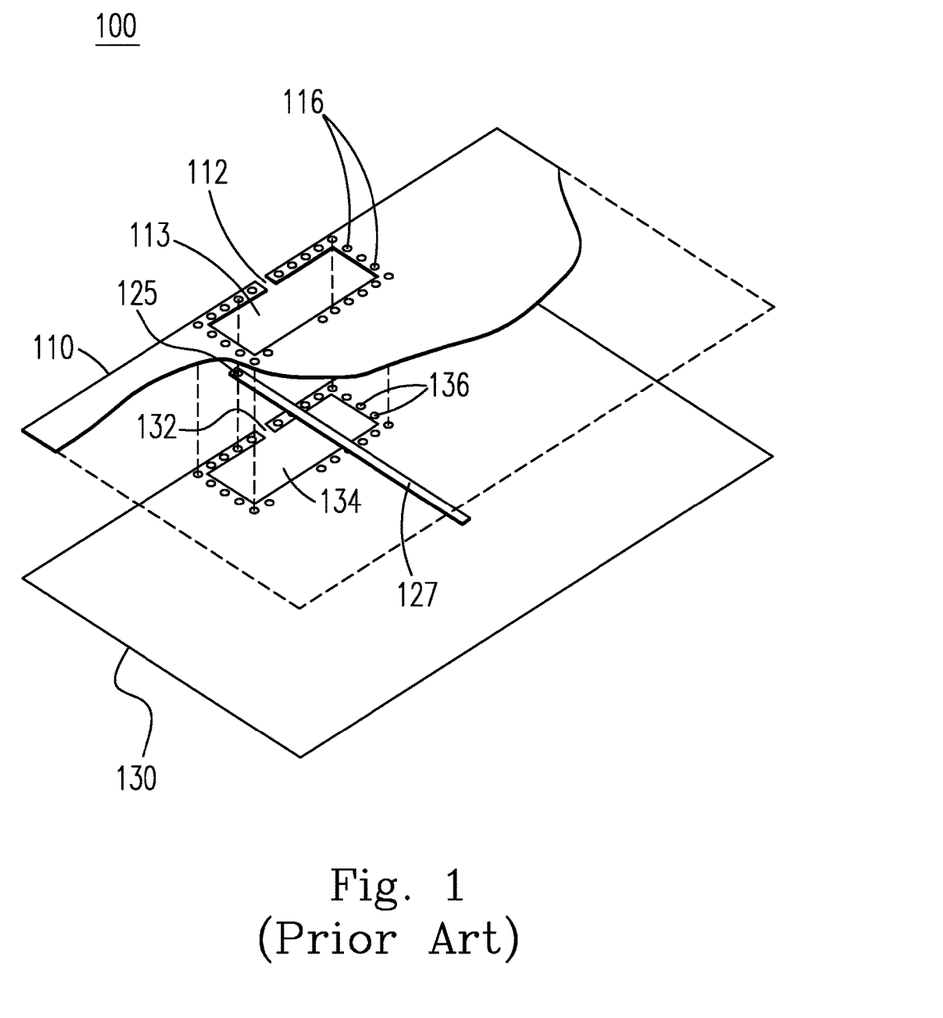
FIG. 1 is a schematic diagram showing a traditional split ring resonator (SRR) antenna device.

Please refer to FIG. 1, which shows a traditional split ring resonator (SRR) device 100, which is disposed on a multi-layered printed circuit board. FIG. 1 shows three conductive layers relevant to the SRR device 100 in the printed circuit board, and a dielectric layer (not shown) is disposed between two adjacent conductive layers of the multi-layered printed circuit board. In FIG. 1, a top conductive layer 110 includes a gap 112 and a cavity 113 connected to the outer edge of the top conductive layer 110 through the gap 112. A plurality of grounding points 116, each of which corresponding to a plurality of connecting points 136 at the ground sheet 130 on the lower layer, are disposed around the cavity 113. Each pair of the ground point 116 and the connecting point 136 is correspondingly connected by a through hole (via) fully plated with metal. The ground sheet 130 also includes a gap 132 and a cavity 134. The conductive layer in the middle includes a feeding portion 125 which can transmit electronic signals (not shown) through a conducting line 127.

The traditional SRR antennas meet the requirements of miniaturization, but are hard to provide sufficient bandwidth, which causes the necessary communication efficacy in the application at the main frequency band of 5 GHz cannot be realized. In addition, the traditional SRR antenna device 100 as shown in FIG. 1 inevitably needs to use through holes for transmitting the antenna signals received from the feeding portion 125 at the middle layer, which would end up with unwanted signal loss because most of the functional elements are located on the top conductive layer 110 of the printed circuit board 100 according to the concepts of typical circuit board design. In order to overcome the drawbacks set forth above in the prior art, a new SRR antenna structure is required.

SUMMARY OF THE INVENTION

Thus, there is a need to develop a novel SRR antenna design with a broadband efficacy to avoid signal loss due to the use of connections for connecting the conductive line coupled to the feeding portion at the middle conductive layer and make the antenna have a better broadband efficacy.

In accordance with one aspect of the present invention, a split ring resonator (SRR) antenna is disclosed. The SRR antenna comprises a substrate, a basic feeding portion, a conductive layer, a first capacitive, a conducting element and a second capacitive. The substrate has an outer edge, a first surface and a second surface opposite to the first surface. The basic feeding portion disposed on the first surface. The conductive layer is disposed on the second surface, and has a gap and a cavity. The first conductive layer defines two sides of the gap to be a first inner edge and a second inner edge, and a first matching element and a second matching are formed from the first inner edge and the second inner edge respectively. The cavity is connected to the outer edge of the substrate through the gap. The first capacitive coupling route is formed between the basic feeding portion and the first matching element. The conducting element is non-co-planar with the basic feeding portion. The second capacitive coupling route is formed between the conducting element and the second matching element.

In accordance with another aspect of the present invention, a split ring resonator (SRR) antenna is disclosed. The SRR antenna comprises a substrate, a first conductive layer, a first feeding portion and a signal line. The substrate has an outer edge, a first surface and a second surface opposite to the first surface. The first conductive layer is disposed on the first surface and has a gap and a cavity. The first feeding portion is disposed inside the cavity. The signal line is electrically connected to the first feeding portion. The first conductive layer defines two sides of the gap to be a first inner edge and a second inner edge. The cavity is connected to the outer edge of the substrate through the gap. The first feeding portion is near the first inner edge.

The wideband antenna design in the present invention can fully satisfy the requirements in terms of being miniature and having suitable bandwidth, and can comprehensively realize the requirements for a main frequency band of 5 GHz according to the IEEE 802.11 specification or even wider bandwidth. Thus, the present invention has utility for industry.

The objectives and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; they are not intended to be exhaustive or to be limited to the precise form disclosed.

Figure 2A:
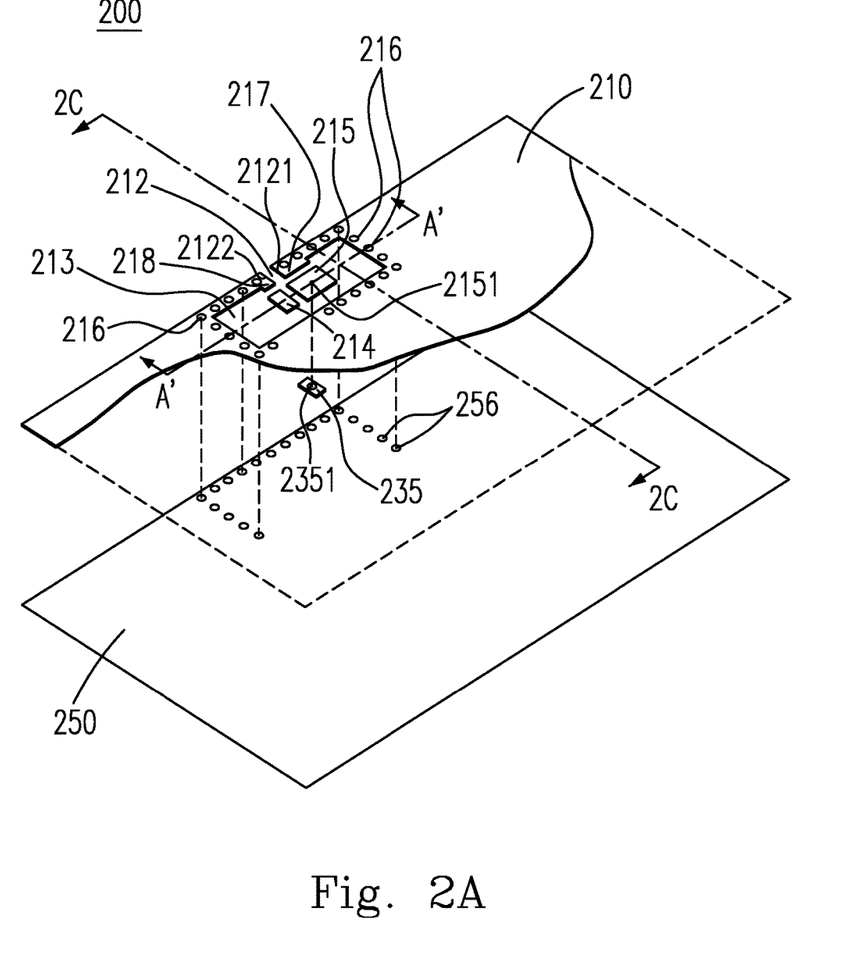
FIG. 2A is a schematic diagram showing an SRR antenna according to one embodiment of the present invention.
Figure 2B:
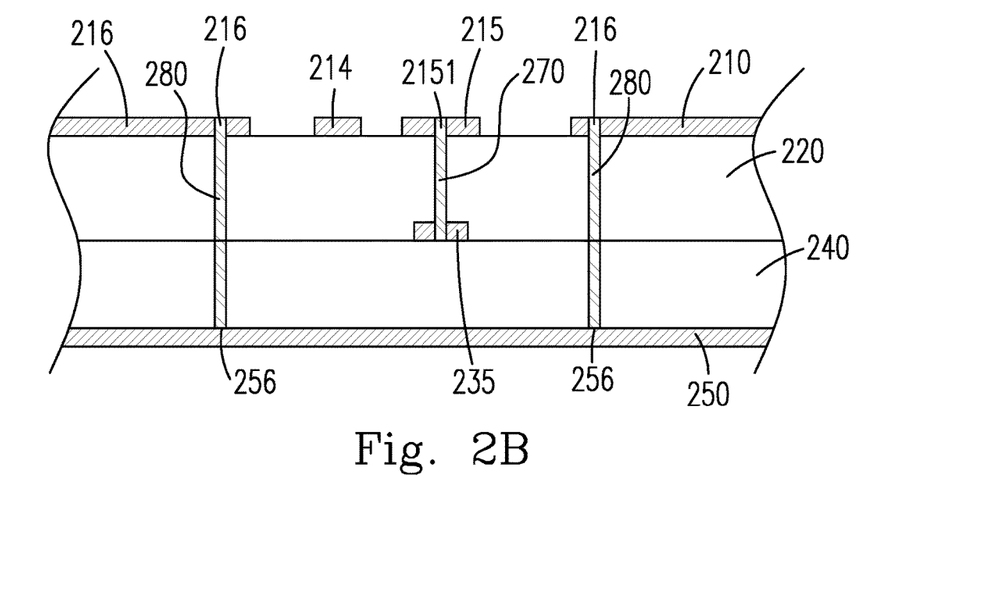
FIG. 2B is a schematic cross-sectional diagram along the dotted line A'-A' in FIG. 2A.
Figure 2C:
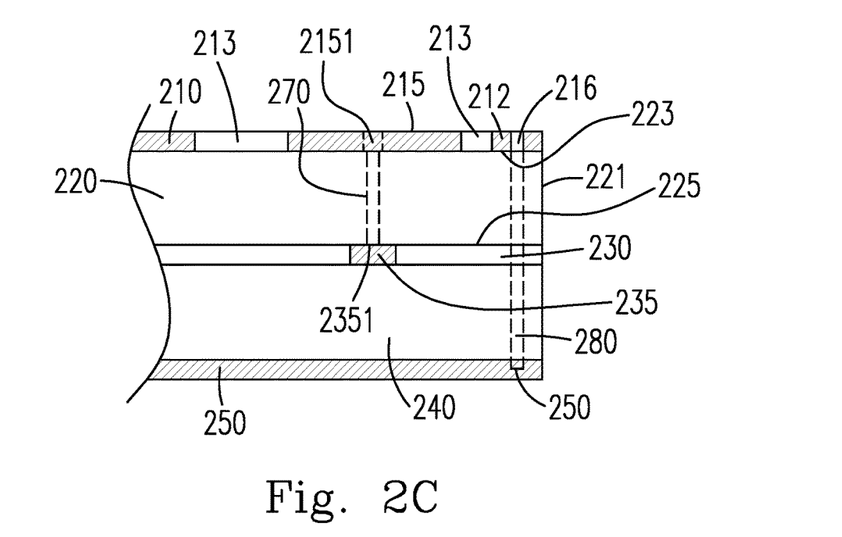
FIG. 2C is a schematic cross-sectional diagram along the dotted line 2C-2C in FIG. 2A.

Please refer to FIGS. 2A-2C, which show an SRR antenna 200 according to one embodiment of the present invention. The SRR antenna 200 is disposed in a multi-layered printed circuit board (PCB), and includes at least a first substrate 220 and a second substrate 240. The illustration of FIG. 2A is to show the relative locations among the main elements on the conductive layers. It is known to the skilled person in the art that a PCB is formed of stacked layers of substrates made of dielectric materials and several metal layers disposed on the two surfaces of each of the substrates. In other words, a PCB is like a sandwich structure having multiple conductive layers wherein dielectric materials are disposed between each of two adjacent ones of the multiple conductive layers. Although the first and the second substrates 220 and 240 are not shown in FIG. 2A, the skilled person in the art can understand there must be a substrate of dielectric materials disposed between each of the two conductive layers for providing insulation therein between. Referring to FIG. 2C, the first substrate 220 has an outer edge 221, a first surface 223 and a second surface 225 opposite to the first surface 223.

According to FIG. 2A, the SRR antenna 200 includes a first conductive layer 210 disposed on the first surface 223. The first conductive layer 210 has a gap 212 and a cavity 213 near the outer edge 221 of the first substrate 220. The cavity 213 is connected to the outer edge 221 through the gap 212. The first conductive layer 210 defines two sides of the gap 212 to be a first inner edge 2121 and a second inner edge 2122. A first feeding portion 215 is disposed inside the cavity 213 and co-planar with the first conductive layer 210. In one embodiment of the present invention, a first matching element 217 is disposed on the first inner edge 2121 and adjacent to the first feeding portion 215 to enhance the coupling effect of the first feeding portion 215 and the split ring resonator. In addition, to further improve the frequency bandwidth of the antenna, a matching portion 214 can be co-planarly disposed in the cavity 213, and is adjacent to the second inner edge 2122 and the first feeding portion 215. For the need of enhancing the electrical coupling effect of the matching portion 214 and the split ring resonator, a second matching element 218 can be disposed on the second inner edge 2122 and adjacent to the matching portion 214.

Please simultaneously refer to FIGS. 2A-2C. The SRR antenna 200 further includes a second conductive layer 230 disposed on the second surface 225 of the first substrate 220 and a second feeding portion 235 corresponding to the first feeding portion 215. A first through hole 270 is disposed between the first conductive layer 210 and the second conductive layer 230 for electrically connecting the contact point 2151 at the first feeding portion 215 and the contacting point 2351 at the second feeding portion 235 and rendering the first feeding portion 215 and the second feeding portion 235 under a conductive status therebetween. Similar to the traditional SRR antennas, the SRR antenna 200 according to the present invention has a grounding layer 250 located under the second substrate 240, i.e., parallel to the first and the second conductive layers 210, 230. Plural grounding points 216 on the first conductive layer 210 are electrically connected to corresponding plural contacting points 256 on the grounding layer 250 through the second through holes 280 disposed therebetween respectively to achieve the effect of grounding.

The size of the cavity 213 in the SRR antenna 200 such as length or width determines the main resonance frequencies of the antenna. To realize an SRR antenna with a main frequency band around 5 GHz, the size of the cavity needs to be of a specific dimension related to the wavelength corresponding to the frequency of 5 GHz, says half or a quarter of the corresponding wavelength. For example, the cavity 213 in the SRR antenna 200 illustrated in FIG. 2A has a length of 4.7 millimeter and a width of 2.2 millimeter.

There is only one cavity element 134 for generating resonance on the top layer 110, which is a conductive layer, of the SRR antenna 100 as shown in FIG. 1. Because the path of inductive current due to the receiving of magnet-electronic wave signals is monotonous, the resonance frequencies generated by the SRR antenna 100 is concentrated at a certain range, and thus the bandwidth is limited. The feeding portion 125 of the traditional SRR antenna 100 is a single element receiving as well as transmitting signals via electrical coupling with the cavity element 134. Due to the limitation of the size of the feeding element which has to be smaller than the cavity, antenna effect of the traditional SRR antenna 100 is usually insufficient. However, in the SRR antenna 200 according to the present invention, the first feeding portion 215 in the cavity 213 is electrically connected to the second feeding portion 235 on the second conductive layer 230, which results in significant increase of the total size of the feeding elements. To further expand the bandwidth, according to another embodiment of the present invention, a smaller matching portion 214 is disposed aside of the first feeding portion 215 in the cavity 213, which renders the antenna effect of the present invention much better than that of the traditional SRR antennas.

From a different aspect of the present invention, the second feeding portion 235 in FIGS. 2A-2C corresponds to the feeding portion 125 in the traditional SRR antenna 100, and may be referred to as a basic feeding portion. According to the structure of the SRR antenna 200, the skilled person in the art can appreciate that a capacitive coupling may occur between the basic feeding portion and the first matching element 217 and therefore a first capacitive coupling route exists between the second feeding portion 235 and the first matching element 217. The first feeding portion 215 is a piece of conductive element. The skilled person in the art can also appreciate that a second capacitive coupling route can be formed through the capacitive coupling between the first feeding portion 215 and the matching portion 214 near-by and the capacitive coupling between the matching portion 214 and the second matching element 218. In addition, capacitive coupling may also be generated between the first feeding portion 215 and the first matching element 217, which forms a third capacitive coupling route. Owing to the existence of these additional capacitive coupling routes, the bandwidth of the SRR antenna according to the present invention is significantly broadened.

Figure 2D:
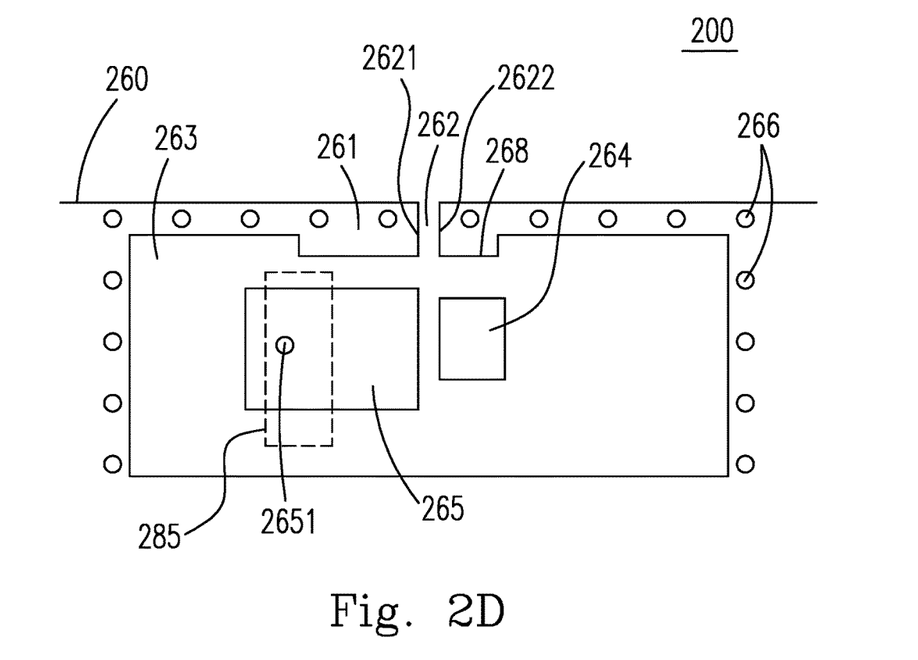
FIG. 2D is a schematic diagram showing an SRR antenna according to another embodiment of the present invention.

Please refer to FIG. 2D, which shows an SRR antenna 200 according to another embodiment of the present invention. Elements in the cavity in FIG. 2D are similar to those in FIG. 2A except that the location of the elements are altered from left to right and vice versa. According to FIG. 2D, the SRR antenna 200 includes a first conductive layer 260 disposed on the first surface 223 of the first substrate 220. The first conductive layer 260 has a gap 262 and a cavity 263 near the outer edge 221 of the first substrate 220. The cavity 263 is connected to the outer edge 221 through the gap 262. The first conductive layer 260 defines two sides of the gap 262 to be a first inner edge 2621 and a second inner edge 2622. A first feeding portion 265 is disposed inside the cavity 263 and co-planar with the first conductive layer 260. In one embodiment of the present invention, a first matching element 261 is disposed on the first inner edge 2621 and adjacent to the first feeding portion 265 to enhance the coupling effect of the first feeding portion 265 and the split ring resonator. In addition, to further improve the frequency bandwidth of the antenna, a matching portion 264 can be co-planarly disposed in the cavity 263, and is adjacent to the second inner edge 2622 and the first feeding portion 215. For the need of enhancing the electrical coupling effect of the matching portion 264 and the split ring resonator, a second matching element 268 can be disposed on the second inner edge 2621 and adjacent to the matching portion 264. The first feeding portion 265 is electrically connected to the second feeding portion 285 underneath through the contact point 2651 on the feeding portion 265. A plurality of grounding points 266 are disposed on the first conductive layer 260.

Figure 3:
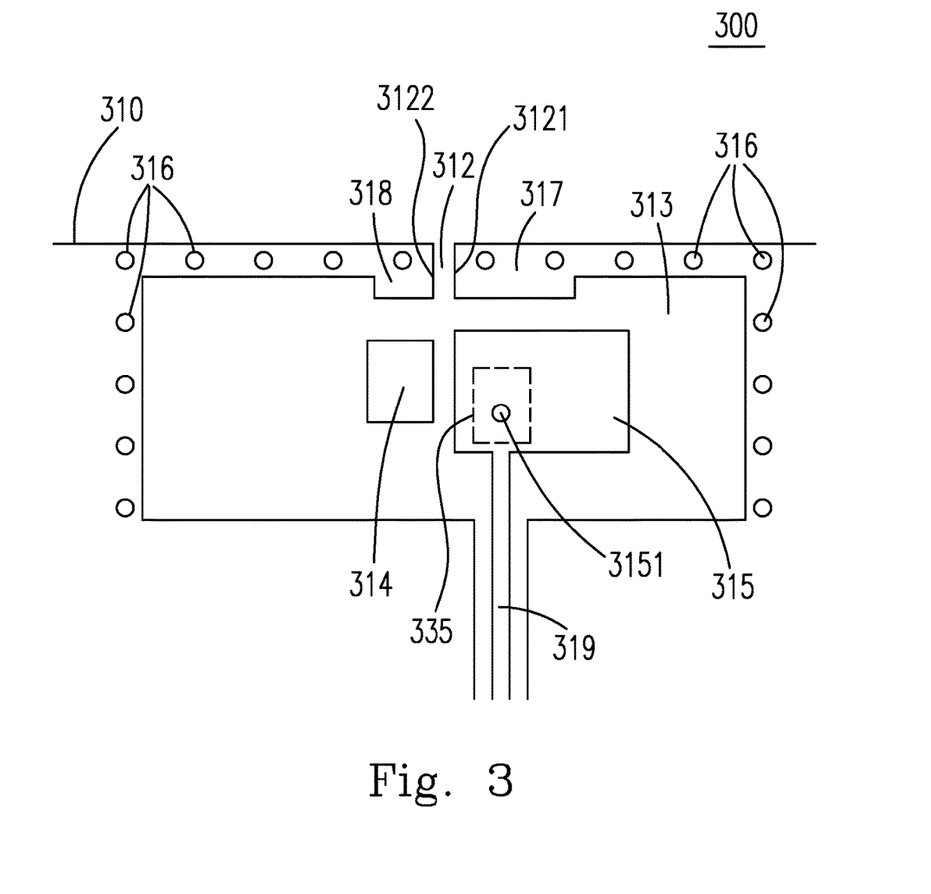
FIG. 3 is a schematic diagram showing an SRR antenna according to yet another embodiment of the present invention.

Please refer to FIG. 3, which shows an SRR antenna 300 according to yet another embodiment of the present invention. The SRR antenna 300 includes a first conductive layer 310 disposed on the first surface 223. The first conductive layer 310 has a gap 312 and a cavity 313 near the outer edge 221 of the first substrate 220. The cavity 313 is connected to the outer edge 221 through the gap 312. The first conductive layer 310 defines two sides of the gap 312 to be a first inner edge 3121 and a second inner edge 3122. A first feeding portion 315 is disposed inside the cavity 313 and co-planar with the first conductive layer 310. In one embodiment of the present invention, a first matching element 317 is disposed on the first inner edge 3121 and adjacent to the first feeding portion 315 to enhance the coupling effect of the first feeding portion 315 and the split ring resonator. In addition, to further improve the frequency bandwidth of the antenna, a matching portion 314 can be co-planarly disposed in the cavity 313, and is adjacent to the second inner edge 3122 and the first feeding portion 315. For the need of enhancing the electrical coupling effect of the matching portion 314 and the split ring resonator, a second matching element 318 can be disposed on the second inner edge 3121 and adjacent to the matching portion 314. The first feeding portion 315 is electrically connected to the second feeding portion 335 underneath through the contact point 3151 on the feeding portion 315. A plurality of grounding points 316 are disposed on the first conductive layer 310.

Antenna signals received by the first feeding portion need to be transmitted to the other functional elements via conducting lines. In the apparatus according to FIGS. 2A and 2D, the first feeding portion 215, 265 can be used as a welding pad for a signal line (not shown) to be directly welded on the first feeding portion 215, 265. In the apparatus according to FIG. 3, the first conductive layer 310 further includes a conducting line 319 electrically connected to the first feeding portion 315 and directly transmitting antenna signals (not shown) to the other functional elements on the first conductive layer 310, which can effectively reduce the distance of signal transmission and reduce the consumption of signal transmission while enhancing the signal quality.

Figure 4:
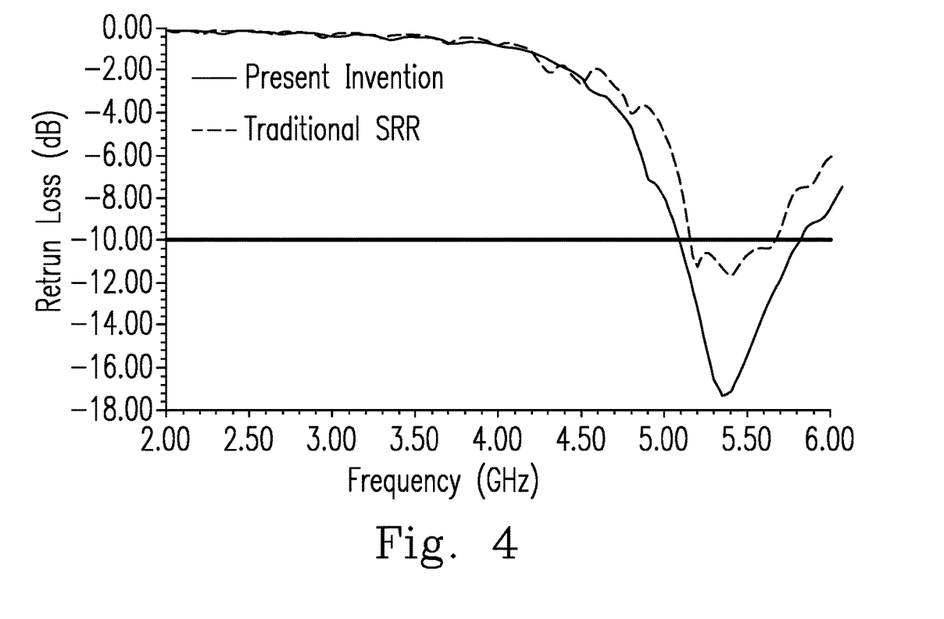
FIGS. 4-6 are schematic diagrams showing the functional characters of an SRR antenna manufactured according to the present invention.

FIG. 4 shows a comparison in terms of the return loss between the SRR antenna according to the present invention and a traditional one in a computer simulation. The simulation data of the SRR antenna design according to the present invention is illustrated with the solid line while that of the traditional SRR antenna is illustrated with the dotted line. It can be found that the available frequency band width of the traditional SRR antenna is significantly less than that of the SRR antenna according to the present invention if the acceptance standard is set on minus 10 dB, so the SRR antenna according to the present invention is much more advantageous over the traditional SRR antenna.

Figure 5:
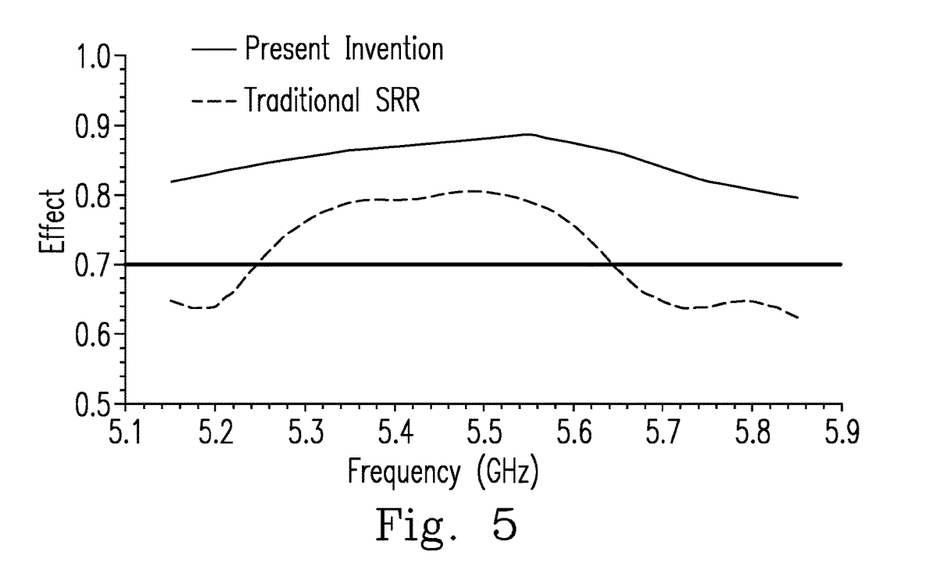

FIG. 5 shows a comparison in terms of the antenna effect between the SRR antenna according to the present invention and a traditional one in a computer simulation. The simulation data of the SRR antenna design according to the present invention is illustrated with the solid line while that of the traditional SRR antenna is illustrated with the dotted line. It can be found that the antenna effect near the frequency of 5.5 GHz of the traditional SRR antenna is significantly less than that of the SRR antenna according to the present invention if the acceptance standard is set on 0.7 or 70%. The effect of SRR antenna according to the present invention at the frequency from 5.1 to 5.9 GHz is equal to or larger than 0.8 or 80%.

Figure 6:
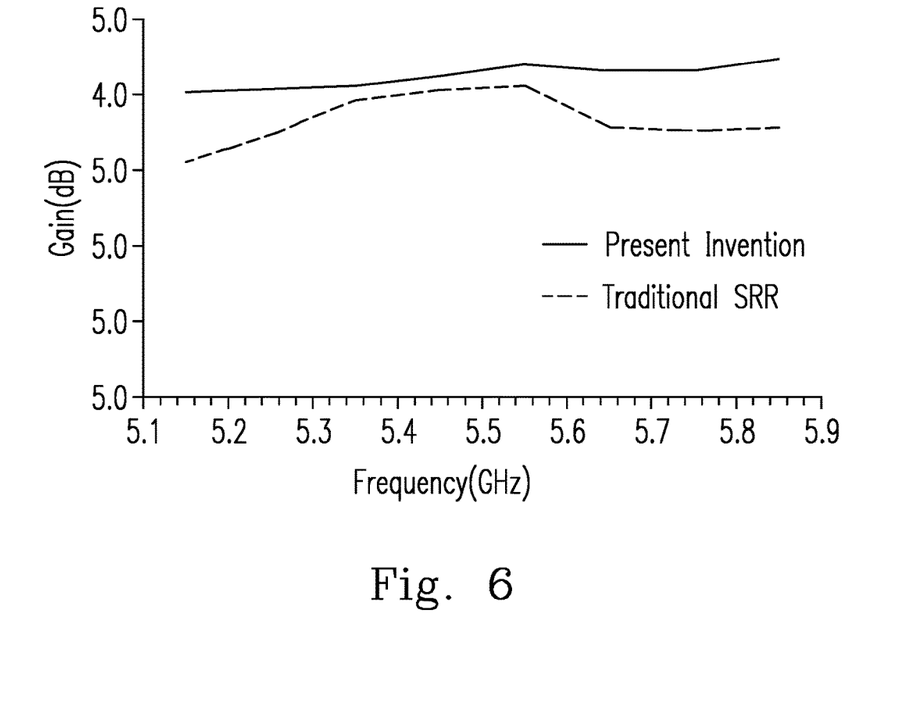

FIG. 6 shows a comparison in terms of the antenna gain between the SRR antenna according to the present invention and a traditional one in a computer simulation. The simulation data of the SRR antenna design according to the present invention is illustrated with the solid line while that of the traditional SRR antenna is illustrated with the dotted line. It can be observed that the gain of SRR antenna according to the present invention at the frequency from 5.1 to 5.9 GHz is significantly advantageous over that of the traditional SRR antenna.

Based on the comparisons in FIGS. 4-6, the skilled person in the art can appreciate that, due to the novel designs of the SRR antenna according to the present invention such as the first feeding portion in the cavity of the first conductive layer and near the first inner edge, the first matching element near the first feeding portion, the matching portion adjacent and co-planar to the first feeding portion, the second matching element near the matching portion and etc., the SRR antenna according to the present invention has better bandwidth and quality of signal. Based on similar design concepts, the present antenna design may also be applicable to antenna specifications for different frequency bands and results in advantageous effects.

Embodiments

1. A split ring resonator (SRR) antenna comprises a substrate, a basic feeding portion, a conductive layer, a first capacitive, a conducting element and a second capacitive. The substrate has an outer edge, a first surface and a second surface opposite to the first surface. The basic feeding portion disposed on the first surface. The conductive layer is disposed on the second surface, and has a gap and a cavity. The first conductive layer defines two sides of the gap to be a first inner edge and a second inner edge, and a first matching element and a second matching are formed from the first inner edge and the second inner edge respectively. The cavity is connected to the outer edge of the substrate through the gap. The first capacitive coupling route is formed between the basic feeding portion and the first matching element. The conducting element is non-co-planar with the basic feeding portion. The second capacitive coupling route is formed between the conducting element and the second matching element.
2. An SRR antenna in Embodiment 1, wherein the conductive layer further includes a matching portion disposed inside the cavity and near the second inner edge.
3. An SRR antenna in Embodiment 1, wherein the conducting element is co-planar with the conductive layer.

4. An SRR antenna in Embodiment 1, wherein the first conductive layer further includes a first matching element disposed on the first inner edge and adjacent to the first feeding portion.
5. An SRR antenna in Embodiment 1, wherein the cavity has a first specific size, the basic feeding portion has a second specific size, and the first specific size is greater than the second specific size.
6. An SRR antenna in Embodiment 5, further comprising a matching portion co-planarly disposed in the cavity, being adjacent to the second inner edge and the basic feeding portion, and having a third specific size.
7. An SRR antenna in Embodiment 6, wherein the second specific size is greater than the third specific size.
8. A split ring resonator (SRR) antenna is comprises a substrate, a first conductive layer, a first feeding portion and a signal line. The substrate has an outer edge, a first surface and a second surface opposite to the first surface. The first conductive layer is disposed on the first surface and has a gap and a cavity. The first feeding portion is disposed inside the cavity. The signal line is electrically connected to the first feeding portion. The first conductive layer defines two sides of the gap to be a first inner edge and a second inner edge. The cavity is connected to the outer edge of the substrate through the gap. The first feeding portion is near the first inner edge.
9. An SRR antenna in Embodiment 8, further comprising a second conductive layer disposed on the second surface, wherein the second conductive layer includes a second feeding portion corresponding to the first feeding portion.
10. An SRR antenna in Embodiment 9, further comprising a grounding layer being parallel to the first conductive layer and the second conductive layer.
11. An SRR antenna in Embodiment 10, further comprising a first through hole disposed between the first conductive layer and the second conductive layer, and between the first feeding portion and the second feeding portion.
12. An SRR antenna in Embodiment 11, further comprising a plurality of second through holes disposed between the first conductive layer and the grounding layer.
13. An SRR antenna in Embodiment 8, wherein the first feeding portion is co-planar with the first conductive layer.
14. An SRR antenna in Embodiment 8, wherein the first conductive layer further includes a first matching element disposed on the first inner edge and adjacent to the first feeding portion.
15. An SRR antenna in Embodiment 14, wherein the cavity has a first specific size, the first feeding portion has a second specific size, and the first specific size is greater than the second specific size.
16. An SRR antenna in Embodiment 15, further comprising a matching portion co-planarly disposed in the cavity, being adjacent to the second inner edge and the first feeding portion, and having a third specific size.
17. An SRR antenna in Embodiment 16, wherein the second specific size is greater than the third specific size.
18. An SRR antenna in Embodiment 16, wherein the first conductive layer further includes a second matching element disposed on the second inner edge and adjacent to the matching portion.
19. An SRR antenna in Embodiment 18, further comprising a first capacitive coupling route existing between the first feeding portion and the first matching element.
20. An SRR antenna in Embodiment 19, further comprising a second capacitive coupling route existing between the matching portion and the second matching element.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:
1. A split ring resonator (SRR) antenna, comprising:
   a substrate having an outer edge, at least two layers including an inner layer and an outer layer, a first surface disposed on the inner layer and a second surface disposed on the outer layer;
   a basic feeding portion disposed on the first surface;
   a conductive layer disposed on the second surface, and having a gap and a cavity, wherein:
      the conductive layer defines two sides of the gap to be a first inner edge and a second inner edge, and a first matching element and a second matching element are formed from the first inner edge and the second inner edge respectively; and
      the cavity is connected to the outer edge of the substrate through the gap;
   a first capacitive coupling route formed between the basic feeding portion and the first matching element;
   a conducting element being non-co-planar with the basic feeding portion; and
   a second capacitive coupling route formed between the conducting element and the second matching element.
2. The SRR antenna according to claim 1, wherein the conductive layer further includes a first matching portion disposed inside the cavity and adjacent to the second inner edge.
3. The SRR antenna according to claim 1, wherein the conducting element is co-planar with the conductive layer.
4. The SRR antenna according to claim 1, wherein the conductive layer further includes a second matching portion disposed inside the cavity and adjacent to the conducting element.
5. The SRR antenna according to claim 1, wherein the cavity has a first specific size, the basic feeding portion has a second specific size, and the first specific size is greater than the second specific size.
6. The SRR antenna according to claim 5, further comprising a matching portion co-planarly disposed in the cavity, being adjacent to the second inner edge and the basic feeding portion, and having a third specific size.
7. The SRR antenna according to claim 6, wherein the second specific size is greater than the third specific size.

* * * * *